July 31, 1962 L. KOLODIN 3,047,737

TRANSISTOR MULTIVIBRATOR CIRCUIT WITH TRANSISTOR GATING MEANS

Filed Jan. 16, 1958

INVENTOR.

Louis Kolodin

BY Morris A. Rabkin

ATTORNEY.

United States Patent Office 3,047,737

Patented July 31, 1962

3,047,737

TRANSISTOR MULTIVIBRATOR CIRCUIT WITH TRANSISTOR GATING MEANS

Louis Kolodin, Collingswood, N.J., assignor to Radio Corporation of America, a corporation of Delaware Filed Jan. 16, 1958, Ser. No. 709,274

8 Claims. (Cl. 307—88.5)

This invention relates to transistorized multivibrator circuits.

Transistor flip-flop circuits are well known. These circuits, however, are limited in speed of operation by the feedback R–C time constant between the control element of one transistor and the output element of a second transistor.

It is an object of this invention to provide a novel triggerable flip-flop which can operate at extremely fast speeds.

It is a further object of this invention to provide a novel triggerable transistor flip-flop whose speed of operation is not limited by the usual feedback R–C time constant of the resistor-capacitor combination employed in most flip-flop circuits of the prior art.

A further object of this invention is to provide a novel triggerable transistor flip-flop which utilizes the storage effect of transistors in order to achieve high speed.

In accordance with this invention, a pair of transistors of a first conductivity type are cross-coupled in known fashion to operate as a bistable multivibrator, or flip-flop. A second pair of gating transistors of the opposite conductivity type are coupled so that one input electrode of each transistor of the second pair is connected together to receive a trigger pulse which may come from a suitable pulse source. A second input electrode of each of the gating transistors is coupled to the flip-flop to "sense" the existing state of the circuit. Due to the "sensing" action, on application of a trigger pulse to the first input electrodes, only one of the gating transistors gates "on" the non-conducting transistor of the multivibrator. When the trigger pulse is removed from the first input electrodes of the gating transistors, the storage in the active gating transistor keeps the then conducting transistor of the flip-flop pair in the "on" condition until the other flip-flop transistor is completely turned off.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
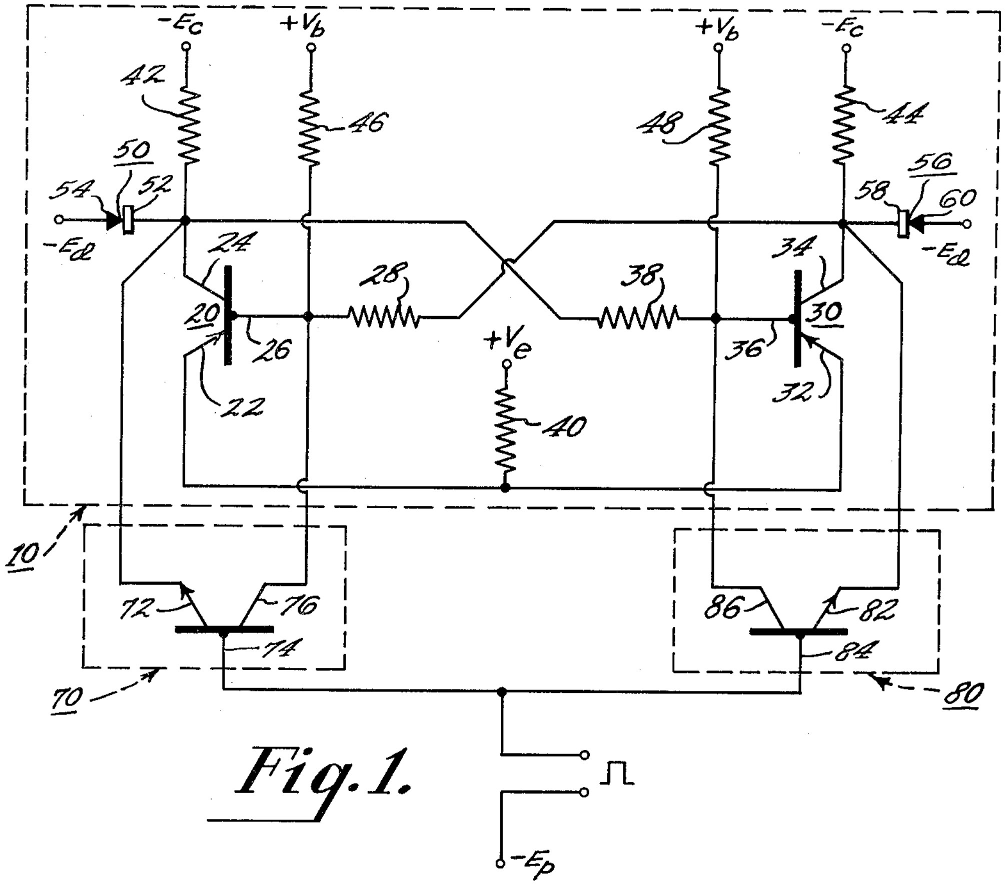
FIGURE 1 is a circuit diagram of one embodiment of this invention.
Figure 2:
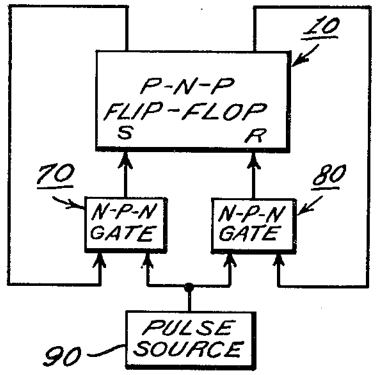
FIGURE 2 is a block diagram incorporating the circuit of FIGURE 1.

Referring to the figures, there is shown a flip-flop 10 having a left PNP transistor 20 cross-coupled with a right PNP transistor 30. Their respective emitters 22, 32 are coupled through an emitter resistor 40 to a positive potential source $+V_e$. The various voltage sources are referenced to a conventional ground connection (not shown). The collectors 24, 34, respectively, are coupled through separate resistors 42, 44 to a negative potential source $-E_c$. The bases 26, 36 of the respective transistors 20, 30 are cross-coupled to the opposite collectors 34, 24 through resistors 28, 38. The base 26 of the left transistor 20 is coupled through a base resistor 46 to the positive potential source $+V_b$. Likewise, the right base 36 is coupled through a resistor 48 to the positive potential source $+V_b$. A biasing diode 50 has its cathode 52 coupled to the collector 24 of the left transistor 20. Another biasing diode 56 has its cathode 58 coupled to the collector 34 of the right transistor 30. The anodes 54, 60 of the diodes 50, 56 are each coupled to a negative biasing source $-E_d$. The potential source $-E_c$ is more negative than the bias source $-E_d$.

A pair of NPN transistors 70, 80 are coupled as gates to trigger the flip-flop. The left NPN transistor 70 has one input electrode, such as its emitter 72, coupled to detect the state of the flip-flop 10. In the embodiment shown in FIGURE 1, the emitter 72 is directly coupled to the collector 24 of the left flip-flop transistor 20. The right NPN transistor 80 has one input electrode, such as emitter 82, coupled to detect the state of the flip-flop 10. However, the input electrode of the right gating transistor 80 detects the opposite state from that detected by the input electrode 72 of the left transistor gate 70. That is, when the input electrode 72 of the left NPN transistor 70 is high or low, the input electrode 82 of the right transistor 80 is low or high, respectively. The right emitter 82 of the NPN gate 80 is directly coupled to the collector 34 of the right flip-flop transistor 30. The second input electrodes of the gates 70 and 80, such as the bases 74, 84 in the embodiment of FIGURE 1, are coupled together to receive a pulse from a suitable pulse source 90. The collector 76 of the left gating transistor 70 is coupled to the left PNP transistor base 26. The collector 86 of the right gating transistor 80 is coupled to the right flip-flop transistor base 36. The collectors of the NPN gating transistors 70, 80 act as outputs of the gates 70, 80 to drive the non-conducting PNP transistors of the flip-flop 10 upon application of a suitable pulse to the bases 74, 84.

In the steady state operation of the circuit, the bases 74, 84 of the gating transistors 70, 80 are coupled to a negative potential $-E_p$. The negative potential $-E_p$ is more negative than the bias potential $-E_d$. In steady state operation, therefore, both the left and the right NPN gating transistors 70, 80 are biased off. During steady state, one of the PNP flip-flop transistors 20, 30 is conducting; the other is not conducting. Assuming that the left flip-flop transistor 20 is conducting and that the right flip-flop transistor 30 is non-conducting, then the following conditions occur throughout the circuit: Current flows through the left transistor 20 to create a voltage drop across the emitter resistor 40. The potential at the emitters 22, 32 of the flip-flop transistors 20, 30 are then approximately at ground potential, or slightly positive. When the left transistor 20 is conducting, the voltage drop across the collector 24 and emitter 22 is very small, thereby causing the left collector 24 to be approximately at ground potential. The voltage drop of approximately $E_c$ volts across the left collector resistor 42 causes the left diode 50 to be biased off.

Because the left flip-flop collector 24 is approximately at ground potential, the base 26 of the right flip-flop transistor 30 is positive due to the base potential $+V_b$ being coupled, through the right base resistor 48, to the right flip-flop base 46. The right transistor 30, therefore, is cut off, causing a high impedance to appear across the collector 34 and the emitter 32 of the right PNP transistor 30. The right flip-flop collector 34, therefore, tends to approach $-E_c$. However, when the collector voltage tends to drop below $-E_d$ current flows from the $-E_d$ source through the diode 56 and resistor 44 to the $-E_c$ source, thereby maintaining the collector 34 at a potential of $-E_d$. This negative potential of $-E_d$ at the right collector 34 is transmitted through the coupling resistor 28 to the left base 26 to maintain the left PNP transistor 20 in its conductive state.

With the bases 74, 84 of the NPN gating transistors 70, 80 maintained at the negative potential $-E_p$, both gating transistors 70, 80 are cut off. Upon the application of a positive going pulse from $-E_p$ to ground potential, the left gating transistor 70 remains cut off.

However, since the right NPN emitter 82 is at a negative potential $-E_d$, the base 84 and emitter 82 of the right NPN transistor 80 are biased in the forward direction to cause conduction through the right gating transistor 80. The right gating transistor collector 86, therefore, approaches a potential of $-E_d$ which, transmitted directly to the right flip-flop base 36, causes the right flip-flop transistor 30 to turn on.

If the pulse applied to the bases 74, 84 of the gating transistors 70, 80 is of such a short duration that the pulse is removed before the left PNP flip-flop transistor 20 can be fully gated off, the right gating NPN transistor 80, by its storage effect, tends to keep the right PNP flip-flop transistor 30 on for a sufficient period of time to cause the left flip-flop transistor 20 to be turned off by virtue of the flip-flop cross-coupling. That is, the right gating transistor 80 keeps the base 36 of the right flip-flop transistor 30 at a negative potential to cause the transistor 30 to conduct, thereby increasing (in a positive direction) the potential of the collector. The left transistor 20, therefore, is cut off due to the resistor 28 coupling the potential at the collector 34 of the right transistor 30 to the base 36 of the left transistor 20.

Various modifications may be made to the circuit without departing from the spirit and scope of this invention. One such modification may be, for example, the utilization of an NPN flip-flop with PNP gates coupled in similar fashion to that described above with opposite polarities used throughout the circuit and with the diodes reversed. With such a modification, a negative pulse is applied to trigger the circuit. Other modifications, for example, may include the detection of the states of the flip-flop at different portions of the flip-flop than that shown in FIGURE 1.

The circuit can be set and reset by known techniques. For example, set and reset terminals could be applied directly to bases 26, 36, respectively, of the flip-flop 10 to set and reset the flip-flop. In such instance, however, only the two flip-flop transistors 20, 30 are in operation. When the circuit is used as a triggerable flip-flop, however, the storage effect of the two trigger transistors is used as memory elements for the trigger operation.

The two NPN transistors used as memory elements are not limited to low frequency transistors with long storage times. In one embodiment of this invention, the circuit operates effectively with transistors having a frequency response of 10 mc. The gain of the gating transistors is also utilized to give fast circuit operation.

In one embodiment, the following circuit values were applied:

| | | |
|---|---|---|
| $-E_c$ | volts | −20 |
| $-E_d$ | do | −6 |
| $-E_p$ | do | −7.5 |
| $+V_b$ | do | +1.5 |
| $+V_e$ | do | +1.5 |
| Collector resistors **42** and **44** each | | 2.2K |
| Cross-coupling resistors **28**, **38** | | 4.7K |
| Base resistors **46**, **48** | | 3.3K |
| Emitter resistor **40** | ohms | 100 |
| Flip-flop transistors **20**, **30** each | | 2N123 |
| Gating transistors **70**, **80** each | | 2N94A |

What is claimed is:

1. Transistor circuitry comprising a flip-flop circuit having a first pair of transistors of a first conductivity type, each of said transistors of said first pair having a first electrode and a second electrode, said flip-flop circuit having a set electrode and a reset electrode; a gating circuit having a second pair of transistors of a second conductivity type, each of said transistors of said second pair having a first electrode, a second electrode, and an output electrode; means coupling one of said electrodes of one transistor of said flip-flop to said first electrode of a first of said transistors of said second pair; means coupling one of said electrodes of the second of said flip-flop transistors to said first electrode of the other transistor of said second pair; means for applying pulses to said second electrodes of said second pair of transistor; direct current coupling means coupling said output electrode of said first transistor of said second pair to said set electrode of said flip-flop; and direct current conducting means coupling said output electrode of said second transistor of said second pair to said reset electrode of said flip-flop.

2. A multivibrator circuit comprising a first pair of transistors of a first conductivity type, each of said transistors having a collector, a base, and an emitter, means coupling said collector of the first of said transistors to said base of the second of said transistors, means coupling said collector of the second of said transistors to said base of said first transistor, means for applying operating potentials to said transistors whereby said first pair of transistors operates as a flip-flop, a third and a fourth transistor, each of said third and said fourth transistors having a collector, a base, and an emitter, linear means coupling said collector of said first transistor to said emitter of said third transistor, linear means coupling said collector of said second transistor to said emitter of said fourth transistor, direct current conducting means coupling said collector of said third transistor to said base of said first transistor, direct current conducting means coupling said collector of said fourth transistor to said base of said second transistor, and means for applying pulses to said bases of said third and fourth transistors.

3. A multivibrator circuit comprising a flip-flop having a pair of transistors of a first conductivity type; a pair of gating transistors of the opposite conductivity type, each of said gating transistors having a pair of input electrodes and an output electrode; said flip-flop having set and reset terminals and having a pair of output electrodes providing complementary outputs when said flip-flop is in a steady state condition; linear means coupling one of said flip-flop output electrodes to one of said input electrodes of one of said gating transistors; linear means coupling the other of said flip-flop output electrodes to one of said input electrodes of the other gating transistors; means for applying pulses to the second input electrodes of said gating transistors; and direct current conducting means coupling said output electrodes of said gating transistors, respectively, to said set and reset terminals of said flip-flop.

4. Transistor circuitry comprising a first pair of transistors coupled to operate as a bistable multivibrator upon the application of suitable operating potentials; a second pair of gating transistors; means for applying pulses to said gating transistors; and direct current conducting means connecting each of said pair of gating transistors to a different one of said first pair of transistors, said pair of gating transistors being adapted to trigger said multivibrator from one stable state to the other stable state in response to each applied pulse.

5. Transistor circuitry comprising a first pair of transistors coupled to operate as a bistable multivibrator upon the application of suitable operating potentials; a second pair of gating transistors of the opposite conductivity type from said first pair of transistors; means for applying pulses to said gating transistors; and direct current conducting means connecting each of said pair of gating transistors to a different one of said first pair of transistors, said pair of gating transistors being adapted to trigger said multivibrator from one stable state to the other stable state in response to each applied pulse.

6. Transistor circuitry comprising a first and a second transistor, each having a collector, a base, and an emitter; means for coupling said collector of said first transistor to said base of said second transistor; means for coupling said collector of said second transistor to said base of said first transistor; means for applying operating potentials to said transistor whereby said transistors operate as a bistable multivibrator; a third and a fourth transistor, each having a collector, a base, and an emitter;

means for coupling said collector of said first transistor to said emitter of said third transistor; direct current conducting means coupling said collector of said third transistor to said base of said first transistor; means coupling said collector of said second transistor to said emitter of said fourth transistor; direct current conducting means coupling said collector of said fourth transistor to said base of said second transistor; a source of trigger pulses and means coupling said bases of said third and fourth transistors to each other and to said source of pulses.

7. Circuitry comprising a flip-flop having a pair of output terminals, a set terminal, and a reset terminal; a pair of gates, each of said gates having a pair of input terminals and an output terminal; direct current conducting means coupling said output terminal of one of said gates to said set terminal of said flip-flop; direct current conducting means coupling said output terminal of the other of said gates to said reset terminal of said flip-flop; linear means coupling one of said output terminals of said flip-flop to one input terminal of the first of said gates, linear means coupling the other of said output terminals of said flip-flop to one input terminal of the other of said gates; and means for applying pulses to the other input terminals of said gates, said gates being adapted to trigger said flip-flop in response to each applied pulse.

8. A system for selectively triggering a flip-flop in response to each signal from a pulse source comprising: a flip-flop having first and second input terminals, and first and second output terminals; a pair of gating transistors each having first and second input electrodes and an output electrode; linear coupling means connecting said first and said second output terminals of said flip-flop to said first input electrodes of said pair, respectively; direct current conducting means coupling each of said first and second input terminals of said flip-flop to a different said output electrode of said pair; and means coupling said pulse source to each of said second input electrodes of said pair, each successive pulse from said source causing a different one of said pair of gating transistors to conduct.

References Cited in the file of this patent

UNITED STATES PATENTS

| | | |
|---|---|---|
| 2,706,811 | Steele | Apr. 19, 1955 |
| 2,816,237 | Hageman | Dec. 10, 1957 |
| 2,885,574 | Roesch | May 5, 1959 |
| 2,909,678 | Jensen | Oct. 20, 1959 |
| 2,916,636 | Wanlass | Dec. 8, 1959 |
| 2,945,965 | Clark | July 19, 1960 |

OTHER REFERENCES

"Transistor Flip-Flops for Digital Computers," A. K. Rapp et al., Electronics Buyers Guide, June 1957, Mid Month.